(12) United States Patent
Mochizuki et al.

(10) Patent No.: US 7,245,350 B2
(45) Date of Patent: Jul. 17, 2007

(54) EXPOSURE APPARATUS

(75) Inventors: Shinya Mochizuki, Utsunomiya (JP); Takashi Kamono, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/611,386

(22) Filed: Dec. 15, 2006

(65) Prior Publication Data

US 2007/0121092 A1    May 31, 2007

Related U.S. Application Data

(63) Continuation-in-part of application No. 11/557,017, filed on Nov. 6, 2006.

(30) Foreign Application Priority Data

Nov. 11, 2005  (JP) .............................. 2005-327568
Dec. 16, 2005  (JP) .............................. 2005-363449

(51) Int. Cl.
*G03B 27/42* (2006.01)
*G03B 27/52* (2006.01)
*G03B 27/62* (2006.01)

(52) U.S. Cl. .............................. 355/53; 355/30; 355/75

(58) Field of Classification Search ................. 355/30, 355/53, 72–76; 430/5, 20, 30; 414/217.1; 361/234

See application file for complete search history.

(56) References Cited

U.S. PATENT DOCUMENTS

| 5,559,584 | A  | * | 9/1996  | Miyaji et al. ................. 355/73 |
| 6,829,038 | B2 | * | 12/2004 | Miwa .......................... 355/53 |
| 6,948,619 | B2 | * | 9/2005  | Su et al. ..................... 206/710 |
| 7,196,769 | B2 | * | 3/2007  | Miyajima .................... 355/30 |
| 2005/0095829 | A1 |  | 5/2005 | Shinichi |

FOREIGN PATENT DOCUMENTS

| JP | 10-261560 | 9/1998 |
| JP | 2005-123292 | 5/2005 |

* cited by examiner

*Primary Examiner*—Henry Hung Nguyen
(74) *Attorney, Agent, or Firm*—Canon U.S.A. Inc I.P. Div

(57) ABSTRACT

An exposure apparatus includes a vacuum chamber, a load-lock chamber disposed between the vacuum chamber and outside the exposure apparatus, a reticle cassette configured to hold a reticle, a conveying unit configured to convey the reticle cassette between the vacuum chamber and the load-lock chamber, and an opening and closing unit configured to open and close the reticle cassette. The opening and closing unit is disposed within the vacuum chamber.

15 Claims, 9 Drawing Sheets

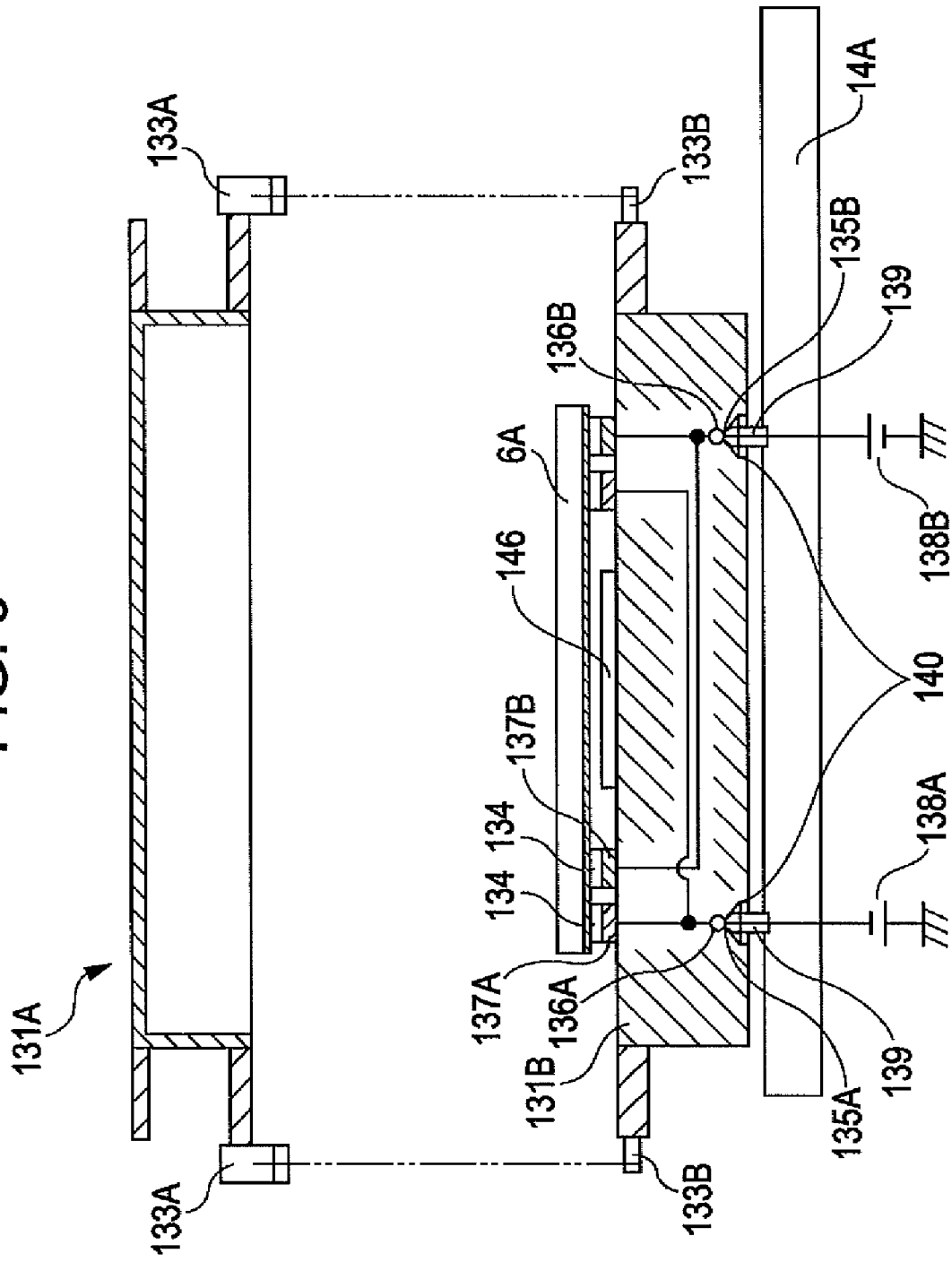

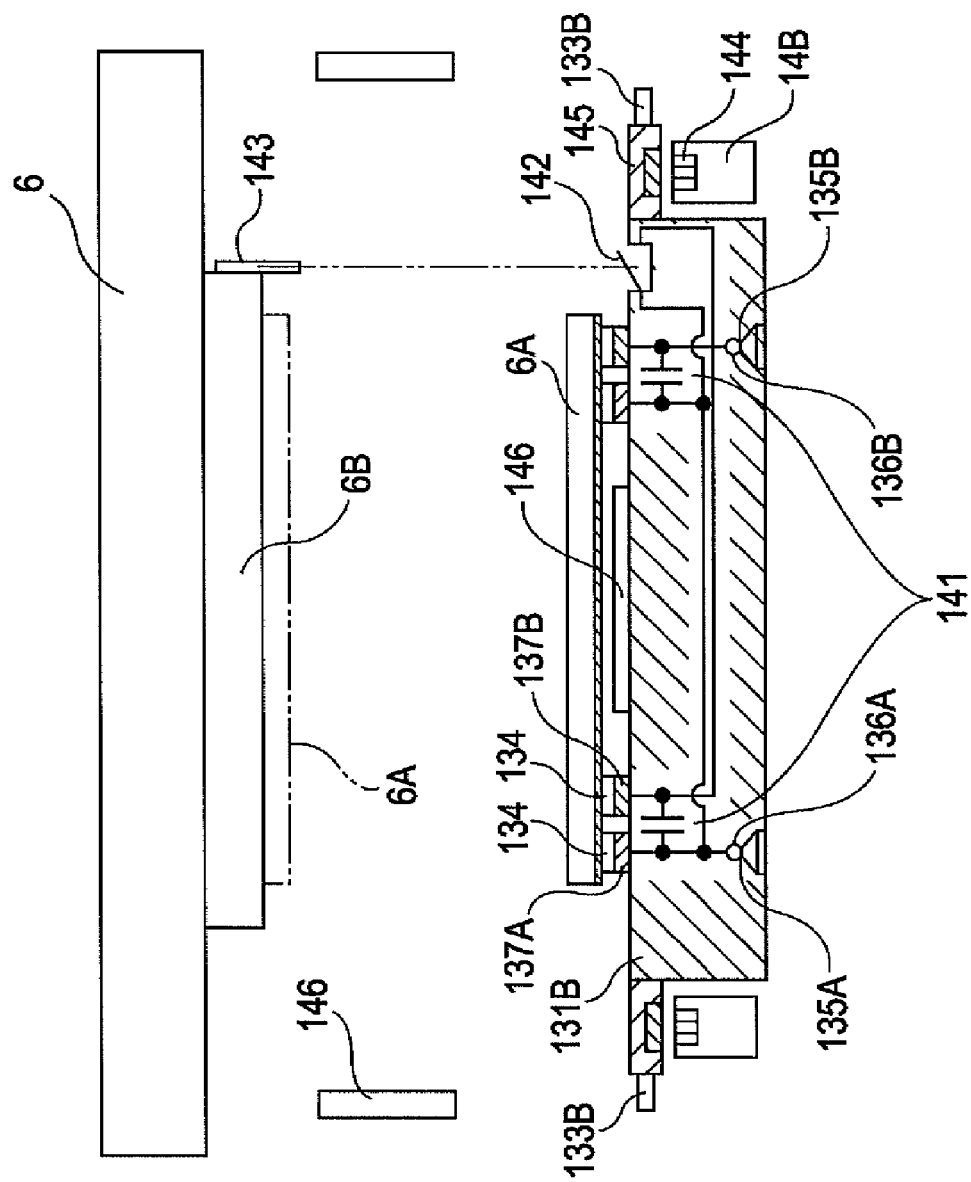

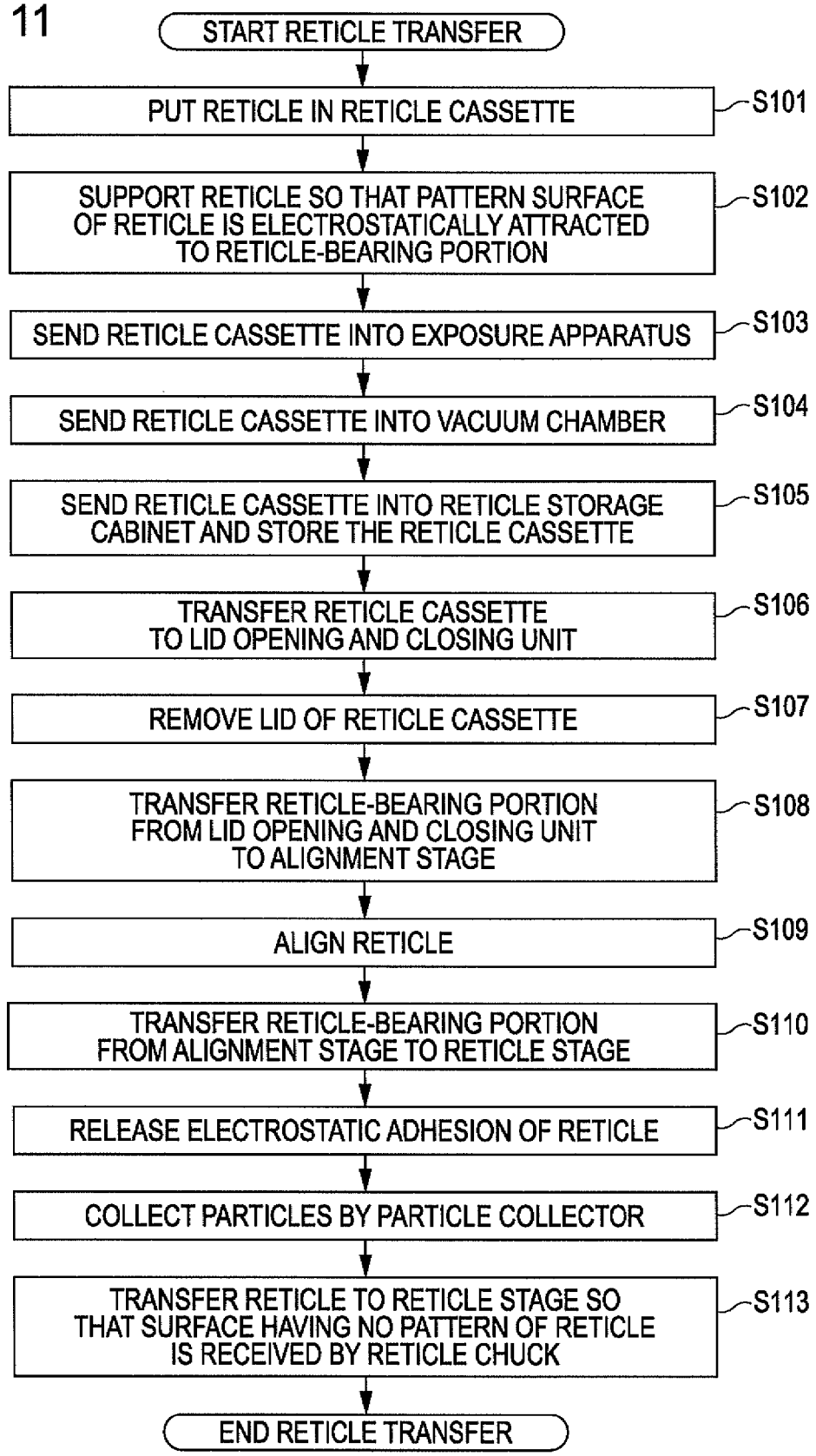

EXPOSURE APPARATUS

CROSS REFERENCE TO RELATED APPLICATIONS

This application is a continuation-in-part of application Ser. No. 11/557,017 filed Nov. 6, 2006, which claims priority to Japanese Application No. 2005-327568 filed Nov. 11, 2005 and No. 2005-363449 filed Dec. 16, 2005, all of which are hereby incorporated by reference herein in their entirety.

BACKGROUND OF THE INVENTION

1. Field of the Invention

The present invention relates to an exposure apparatus used in manufacturing a device having a fine pattern, such as a semiconductor device.

2. Description of the Related Art

Semiconductor manufacturing systems perform multiple processes on a wafer, and each process is performed in a state controlled so that an environment appropriated for the process is maintained. However, since environments appropriate for apparatuses vary with one another, it has become necessary to control an environment around the wafer during each of the processes and conveyance the wafer.

In exposure apparatuses for transferring a fine pattern, such as a circuit pattern, to a semiconductor wafer or a substrate, such as a substrate used for a liquid crystal display, a finer transfer pattern and an improved throughput are required. To obtain the finer transfer pattern, it is necessary for an exposure apparatus to reduce the wavelength of exposure light. Therefore, in addition to an exposure wavelength of an I line of 365 nm, recently, a krypton-fluoride (KrF) excimer laser of 248 nm and an argon-fluoride (ArF) excimer laser of 193 nm have been developed. For further finer patterns, development of a fluorine (F2) excimer laser of 157 nm and extreme ultraviolet (EUV) light is required.

However, because exposure light with a short wavelength, as described above, significantly decreases in the atmosphere, it is necessary to perform exposure in a decompressed space or a space purged with inert gas (e.g., N2 or He). Therefore, an exposure portion in an exposure apparatus is accommodated within a chamber whose environment is controlled.

To efficiently carry a wafer or reticle in and out of such a chamber, a load-lock mechanism is provided at an interface between an interior space and an exterior space. The load-lock mechanism includes a load-lock chamber and a gate valve capable of opening and closing communication between the load-lock chamber and each of the interior and exterior spaces.

For carrying the wafer or reticle out of the exterior space, the waver or reticle is first carried in the load-lock space in a state in which the load-lock chamber is isolated from the interior space. Then the load-lock chamber is decompressed or purged after the load-lock chamber is isolated from the exterior space. Then communication is established between the load-lock chamber and the interior space, and the wafer or reticle is carried in the interior space.

For carrying the wafer or reticle out of the interior space, the wafer or reticle is carried in the load-lock chamber in a state in which the load-lock chamber is isolated from the exterior space. Then the load-lock chamber is opened to atmosphere after the load-lock chamber is isolated from the interior space. Then communication is established between the load-lock chamber and the exterior space, and the wafer or reticle is carried to the exterior space.

The reticle is carried in and out while being contained in a reticle cassette in order to avoid dust from attaching to the reticle. Japanese Patent No. 3,320,628 discloses that, for carrying a sample in a vacuum processing chamber, a reticle cassette is carried in a load-lock chamber, the load-lock chamber is evacuated to a vacuum atmosphere, and the sample is then taken out of the reticle cassette.

When the reticle is taken out of the reticle cassette, dust is inevitably generated from a mechanism for opening and closing the reticle cassette. When the reticle cassette is opened and closed within the load-lock chamber, as described above, dust may rise during breakage of a vacuum of the load-lock chamber, and the dust may attach to a wall or ceiling of the load-lock chamber. The dust attaching to the ceiling or the like may fall onto the reticle taken out of the reticle cassette. This may cause common defects of an exposed device pattern or deteriorate flatness of the reticle, so that the quality of exposure may decline.

In the case where the reticle is taken out of the reticle cassette in the load-lock chamber and the reticle is stored in the vacuum processing chamber, because no protection of the reticle against dust is present, there is a possibility that the reticle is contaminated with the dust when being stored or conveyed.

In particular, if a vacuum of the vacuum processing chamber is broken when a problem occurs, dust in the vacuum processing chamber may rise and attach to the ceiling or the like, and the dust may fall onto the reticle. This may cause common defects of an exposed device pattern or deteriorate flatness of a reticle, so that the quality of exposure may decline.

SUMMARY OF THE INVENTION

The present invention is directed to an exposure apparatus that provides a reduction in a possibility that dust attaches to a reticle when the reticle is conveyed or stored. The present invention is also directed to a method of manufacturing a device using the exposure apparatus.

According to one aspect of the present invention, an exposure apparatus includes a vacuum chamber, a load-lock chamber disposed between the vacuum chamber and outside the exposure apparatus, a reticle cassette configured to hold a reticle, a conveying unit configured to convey the reticle cassette between the vacuum chamber and the load-lock chamber, and an opening and closing unit for opening and closing the reticle cassette, the opening and closing unit being disposed within the chamber.

Further features of the present invention will become apparent from the following description of exemplary embodiments with reference to the attached drawings.

BRIEF DESCRIPTION OF THE DRAWINGS

FIG. 9 illustrates a structure in which the conveyance arm includes sending terminals according to the fourth exemplary embodiment.

FIG. 10 is an illustration for describing a transfer of a reticle to a reticle stage according to the fourth exemplary embodiment.

FIG. 11 is a flow chart illustrating a process of conveying the reticle according to the fourth exemplary embodiment.

DESCRIPTION OF THE EMBODIMENTS

Exemplary embodiments are described below with reference to the drawings.

First Exemplary Embodiment

Figure 1:
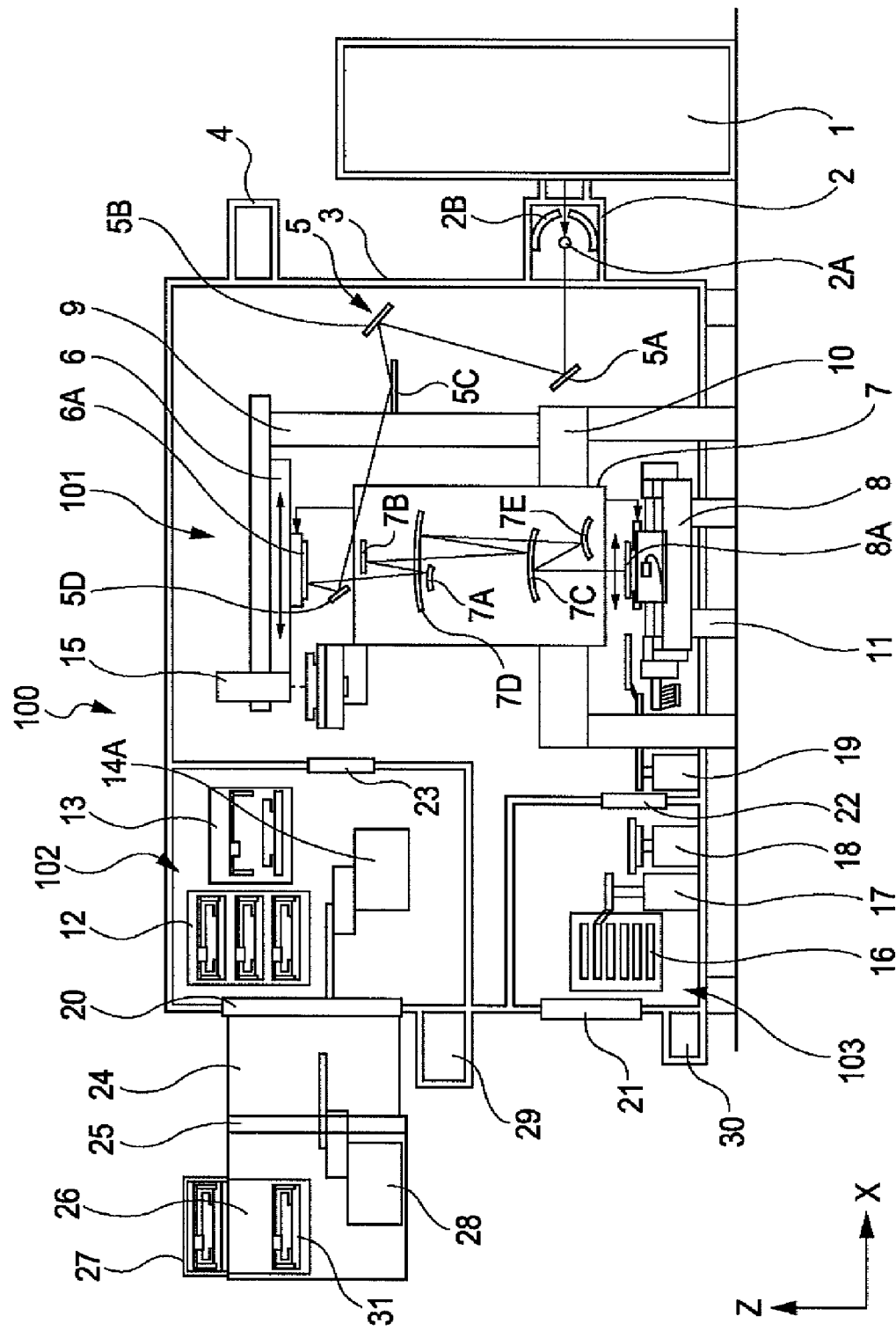
FIG. 1 is a side view of an exposure apparatus according to a first exemplary embodiment of the present invention.

FIG. 1 illustrates an overview of an exposure apparatus. The exposure apparatus includes a laser generation portion 1 and a light-emitting portion 2, both for generating exposure light, and a main body 100 for performing exposure using the exposure light.

When the laser generation portion 1 generates laser light, the light-emitting portion 2 is radiated with the laser light. The inside of the light-emitting portion 2 is maintained under vacuum. The light-emitting portion 2 includes a light source 2A and a mirror 2B therein. The light source 2A is formed by gasification, liquefaction, or atomization of a light source material. Examples of the light source material include xenon. The laser light is used for plasma-exciting atoms of the light source material, and examples of the laser light include the one produced from a YAG solid-state laser. The mirror 2B can have a hemispherical shape whose center is the light source 2A. The mirror 2B is used for directing light emitted from the light source 2A as a result of being plasma-excited and used for gathering and reflecting the light. Through such a structure, the light-source material is ejected from a nozzle (not shown) and radiated with the laser light, so that exposure light is generated. The generated exposure light is guided to the main body 100.

The main body 100 includes a vacuum chamber 3, an exposure unit 101 disposed in the vacuum chamber 3, a reticle conveyance unit 102, and a wafer conveyance unit 103. The vacuum chamber 3 can maintain a vacuum of the interior by using a vacuum pump 4. The exposure unit 101 includes an illumination optical system 5, a reticle stage 6, a projection optical system 7, and a wafer stage 8.

The illumination optical system 5 includes an optical element, such as mirrors 5A to 5D. The illumination optical system 5 shapes and homogenizes exposure light guided from the light-emitting portion 2 by using the optical element. The shaped and homogenized exposure light is guided to a reticle 6A on the reticle stage 6.

The reticle stage 6 can move along the directions indicated by the arrows in the Figure. The reticle stage 6 further includes a driving mechanism for precise positioning. The reticle stage 6 is supported with respect to a floor by a reticle-stage support 9. The reticle 6A includes an exposure pattern. The exposure light is reflected by the reticle 6A.

The projection optical system 7 includes an optical element, such as mirrors 7A to 7E. The projection optical system 7 reduces the exposure pattern of the reticle 6A and projects the exposure pattern onto a wafer 8A on the wafer stage 8. The projection optical system 7 is supported with respect to the floor by a projection-optical-system support 10.

The wafer stage 8 can move in the x, y, and z directions, the ωx-direction (direction of rotation about the x-axis), the ωy-direction (direction of rotation about the y-axis), and the ωz-direction (direction of rotation about the z-axis). The wafer stage 8 can be driven by using, for example, a linear motor. The wafer stage 8 is supported with respect to the floor by a wafer-stage support 11.

The relative positions of the reticle stage 6 and the wafer stage 8 with respect to the projection optical system 7 are measured by respective laser interferometers (not shown). The relative position between the projection optical system 7 and each of the stages can be maintained by control of respective driving units (not shown) on the basis of the measurement results. The reticle-stage support 9, the projection-optical-system support 10, and the wafer-stage support 11 are provided with respective support mechanisms (not shown) so as to be isolated from vibrations from the floor.

The reticle conveyance unit 102 is further described below. The reticle conveyance unit 102 includes a reticle storage cabinet 12, a reticle conveyance robot 14A, and a lid opening and closing mechanism 13. The reticle storage cabinet 12 is configured to store a plurality of reticle cassettes 31, and each of the reticle cassettes 31 contains a reticle therein. This allows reticles having different patterns and reticles used under different exposure conditions to be stored in the exposure apparatus.

Figure 3:
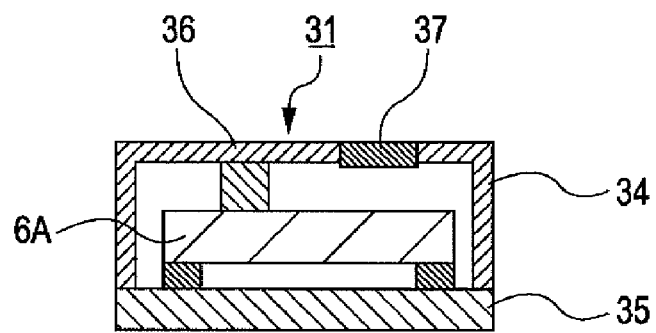
FIG. 3 is a schematic view of a first structure of a reticle cassette according to the first exemplary embodiment.

FIG. 3 is a schematic view of the reticle cassette 31. The reticle cassette 31 includes an upper lid 34 and a lower dish 35. The reticle 6A is supported by the lower dish 35. When the upper lid 34 is closed, a locking mechanism (not shown) produces a force that presses the upper lid 34 and the lower dish 35 from above and below. The upper lid 34 is provided with a reticle holder 36. During conveyance of the reticle 6A, the upper lid 34 is closed, so that the reticle 6A is fixed by the reticle holder 36 and the lower dish 35. The structure described above can suppress dust generation caused by rubbing between the reticle 6A and the lower dish 35. The upper lid 34 is also provided with a filter 37, and this prevents the occurrence of a pressure difference between the inside and the outside of the cassette.

The reticle conveyance robot 14A conveys a reticle cassette 31 containing a reticle 6A to be used in exposure from the reticle storage cabinet 12 to the lid opening and closing mechanism 13. The lid opening and closing mechanism 13 opens the upper lid of the reticle cassette 31. The reticle conveyance robot 14A conveys the reticle cassette 31 whose upper lid is opened by the lid opening and closing mechanism 13 to a cassette support portion disposed below a reticle alignment scope 15. The reticle conveyance robot 14A includes a conveyance arm and performs the conveyance while the lower dish 35 is placed on the conveyance arm.

The reticle 6A on the conveyed lower dish 35 is aligned (registered) with an alignment mark based on the projection optical system 7. During the alignment, the reticle 6A is slightly moved by a mechanism (not shown) in the directions of rotation about the x-, y-, and z-axes. After being aligned, the reticle 6A is delivered from the lower dish 35 onto the reticle stage 6. During the delivery, the cassette support portion is raised or the reticle stage 6 is lowered in order to directly deliver the reticle 6A when both the cassette support portion and the reticle stage 6 are near to each other. At this time, the amount of inclination of the reticle 6A and that of the reticle stage 6 are adjusted. After the reticle 6A is delivered to the reticle stage 6, the lower dish 35 is returned to the lid opening and closing mechanism 13 by the reticle conveyance robot 14A, the upper lid 34 is closed, and the empty reticle cassette 31 is then stored in the reticle storage cabinet 12.

In the present invention, it is useful that two or more lid opening and closing mechanisms 13 are provided in order to conform to a multiple exposure process and in order to reduce the time needed to change the reticle. In addition, it is useful that the reticle conveyance robot 14A be a double-arm robot in order to change the reticle at high speeds. The double-arm robot is a mechanism that has two conveyance arms. A case is described below in which the two lid opening and closing mechanisms 13 are provided and the reticle conveyance robot 14A is a double-arm robot.

During exposure, the reticle storage cabinet 12 stores an empty reticle cassette that contained a reticle being subjected to the exposure. At this time, the reticle conveyance robot 14A retrieves this reticle cassette from the reticle storage cabinet 12 with a first arm, and the first arm conveys the reticle cassette to a first lid opening and closing mechanism. The first lid opening and closing mechanism opens a lid of the reticle cassette, and the first arm then conveys a lower dish of the reticle cassette (hereinafter referred to as a lower dish A) to a reticle delivery position. At this time, a second arm of the reticle conveyance robot 14A retrieves a reticle cassette that contains a reticle to be exposed next from the reticle storage cabinet 12 and conveys the retrieved reticle cassette to a second lid opening and closing mechanism. The second lid opening and closing mechanism opens a lid of the reticle cassette, and the second arm then conveys a lower dish of the reticle cassette (hereinafter referred to as a lower dish B) to the vicinity of the reticle delivery position.

After the exposure is completed, the reticle that was used for the exposure is delivered to the lower dish A, and the lower dish B is conveyed to the reticle delivery position by the second arm. The lower dish A is conveyed to the first lid opening and closing mechanism by the first arm. The first lid opening and closing mechanism closes the lid, and the lower dish A is then conveyed as the reticle cassette to the reticle storage cabinet 12 and stored therein. After the reticle on the lower dish B is delivered to the reticle stage 6, the lower dish B is conveyed to the second lid opening and closing mechanism by the second arm. The second lid opening and closing mechanism closes the lid, and the lower dish B is then conveyed as the reticle cassette to the reticle storage cabinet 12 and stored therein.

A space where the reticle storage cabinet 12 and the reticle conveyance robot 14A are disposed (hereinafter referred to as reticle storage space) and a space where exposure is performed (hereinafter referred to as exposure space) are separated from each other by a partition. The partition is provided with a gate valve 23. When the lower dish of the reticle cassette is delivered to the reticle stage, the gate 23 valve is opened and closed. The vacuum state of the reticle storage space is maintained by a vacuum pump 29.

A mechanism for conveying the reticle cassette from outside the main body 100 to inside the exposure apparatus is described below. To convey the reticle cassette from outside the exposure apparatus, a sealing container 27, which is called a standard mechanical interface (SMIF) pod, is used. The SMIF pod 27 is configured to retain a reticle cassette. To bring the reticle cassette retained in the SMIF pod 27 into the exposure apparatus through opening and closing the SMIF pod 27, an open/close elevating device (hereinafter referred to as indexer) 26 is used. The reticle cassette brought in the exposure apparatus by the indexer 26 is conveyed to a load-lock chamber 24 by a reticle conveyance robot 28.

The load-lock chamber 24 is provided with a gate valve 25 at a side adjacent to the atmosphere (adjacent to the indexer 26) and a gate valve 20 at a side adjacent to the vacuum (adjacent to the reticle storage cabinet 12). For opening the load-lock chamber 24 to the atmosphere, the gate valve 25 is opened in a state in which the gate valve 20 is closed. For evacuating the load-lock chamber 24, the gate valve 20 is opened in a state in which the gate valve 25 is closed. At this time, because the gate valve 23 is closed, the degree of vacuum of the space for performing exposure can be prevented from decreasing. The reticle conveyance robot 14A conveys the reticle cassette from the load-lock chamber 24 to the reticle storage cabinet 12.

The wafer conveyance unit 103 is further described below. The wafer conveyance unit 103 includes a wafer storage cabinet 16, a wafer conveyance robot 17, a pre-alignment portion 18, and a wafer feed arm 19. The wafer storage cabinet 16 is configured to store a plurality of wafers conveyed from outside the exposure apparatus. When each of the wafers is conveyed from outside the main body 100 to the wafer storage cabinet 16, a gate valve 21 is opened and closed. The wafer can be conveyed via a load-lock mechanism (not shown).

The wafer conveyance robot 17 conveys a wafer to be subjected to exposure processing from the wafer storage cabinet 16 to the pre-alignment portion 18. The pre-alignment portion 18 includes a unit configured to coarsely adjust the position of the wafer in a direction of rotation and a unit configured to adjust the temperature of the wafer. The position is adjusted by using a notch and/or an orientation flat formed on the wafer. The temperature of the wafer is adjusted so as to correspond to the temperature of the exposure space. The wafer whose position and temperature have been adjusted is delivered to the wafer stage 8 by the wafer feed arm 19.

The exposure space and a space where the wafer storage cabinet 16 and the pre-alignment portion 18 are disposed (hereinafter referred to as wafer storage space) are separated from each other by a partition. The partition is provided with a gate valve 22. When the wafer is carried in or out of the exposure space, the gate valve 22 is opened and closed. The vacuum state of the wafer storage space is maintained by a vacuum pump 30.

In the exemplary embodiment described above, the lid opening and closing mechanism for the reticle cassette is disposed in a space that is different from both the exposure space and the load-lock space, and the unit configured to exhaust air from the space is different from the exhausting unit used in the exposure space and the load-lock space. Therefore, outgassing and particles from the lid opening and closing mechanism and the wafer/reticle conveyance units do not affect the exposure space.

If the lid opening and closing mechanism is disposed in the load-lock space, dust generated in the load-lock space when the lid is opened or closed would rise when the load-lock space is opened to the atmosphere state from the vacuum state. The rising dust may attach to the ceiling of the load-lock chamber and fall onto the reticle. This may cause common defects of an exposed device pattern or deteriorate flatness of the reticle, so that the quality of exposure may decline.

If the reticle is retrieved from the reticle cassette in the load-lock space and is stored in the vacuum processing chamber, because no protection of the reticle against dust is present, there is a possibility that the reticle is contaminated with the dust when being stored. In particular, if the vacuum of the vacuum processing chamber is broken when a problem occurs, dust in the vacuum processing chamber may rise and fall onto the reticle. This may cause common defects of an exposed device pattern or deteriorate flatness of the reticle, so that the quality of exposure may decline.

Figure 2:
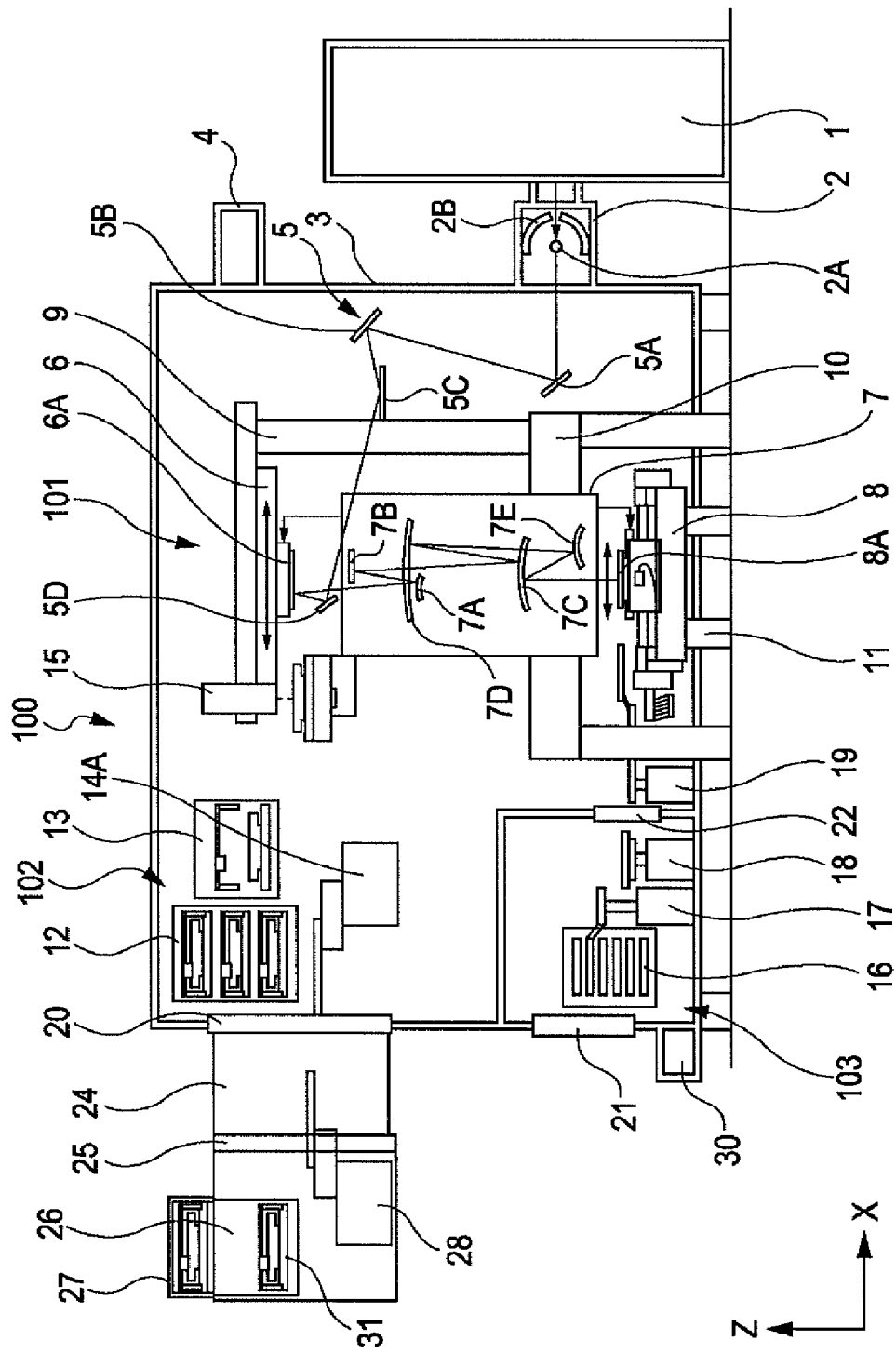
FIG. 2 illustrates an arrangement in which a lid opening and closing mechanism is disposed in an exposure space according to the first exemplary embodiment.

From the viewpoint of preventing rising of dust in the load-lock chamber, as illustrated in FIG. 2, the lid opening and closing mechanism 13 can be disposed in the exposure space. Even with this structure, common defects of a device pattern can be prevented, the flatness of the reticle can be satisfactorily maintained, and a high exposure quality can be realized.

Second Exemplary Embodiment

Figure 4:
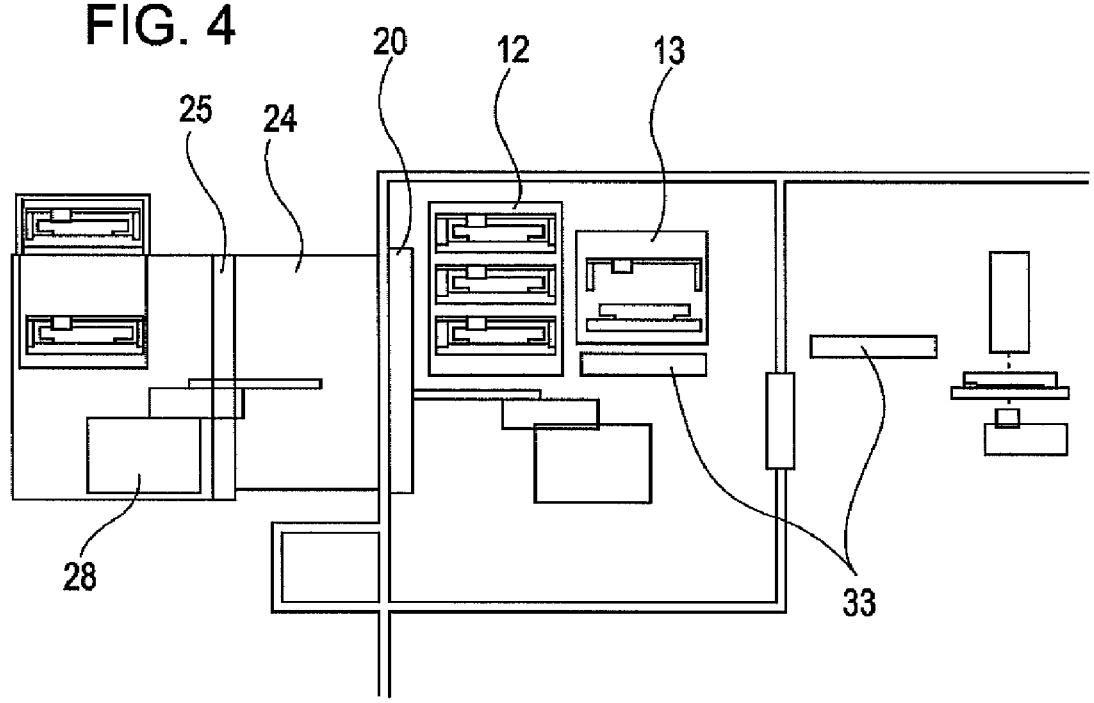
FIG. 4 illustrates a reticle conveyance unit according to a second exemplary embodiment of the present invention.

FIG. 4 illustrates a second exemplary embodiment of the present invention and is an enlarged view of the reticle conveyance unit illustrated in FIG. 1. The parts not described in particular are the same as in the first exemplary embodiment.

The lid opening and closing mechanism for the reticle cassette has contact separation or sliding. Therefore, there can be dust generation. Even if a position of a seal is devised with the aim of avoiding the generated dust from attaching to the reticle, dust falls onto the vicinity of the lid opening and closing mechanism. If such dust is left, the dust rises when the reticle storage space is opened to the atmosphere state from the vacuum state and attaches to the wall and/or the ceiling. The attached dust may fall onto the top of the reticle. This can be a cause of reducing yield.

In this exemplary embodiment, a dust suction device 33 for sucking dust generated when the lid is opened or closed using the lid opening and closing mechanism 13 is provided. The dust suction device 33 is disposed in the vicinity of the lid opening and closing mechanism 13. It is useful that the dust suction device 33 is disposed below the lid opening and closing mechanism 13 in the direction of gravity because rising of dust is few in vacuum. This structure allows dust to be immediately sucked near an area where dust is generated, and therefore, the generated dust can be prevented from moving to any location and attaching thereto.

While being conveyed from the lid opening and closing mechanism to the reticle delivery position, the reticle cassette has no upper lid, and as a result, dust may attach to the top of the reticle. Although no exposure pattern is present on the top of the reticle, because the reticle holding portion holds the top of the reticle, the attached dust may decrease the flatness of the reticle. This can be a cause of reducing the quality of exposure.

In this exemplary embodiment, the dust suction device 33 is disposed between the lid opening and closing mechanism 13 and the reticle delivery position. The dust suction device 33 is disposed so that dust does not attach onto the reticle when the lower dish of the reticle cassette is conveyed from the lid opening and closing mechanism 13 to the reticle delivery position. It is useful that the dust suction device 33 suck dust using at least one of thermophoresis, static electricity, and a laser trap.

When the reticle is contained in the reticle cassette, the upper lid prevents dust from attaching to the top of the reticle. When the reticle is positioned on the reticle stage, dust is prevented from attaching to the top of the reticle by a reticle chuck coming into close contact therewith. The use of the dust suction device described above can significantly reduce a possibility that dust attaches onto the reticle.

Third Exemplary Embodiment

Figure 5:
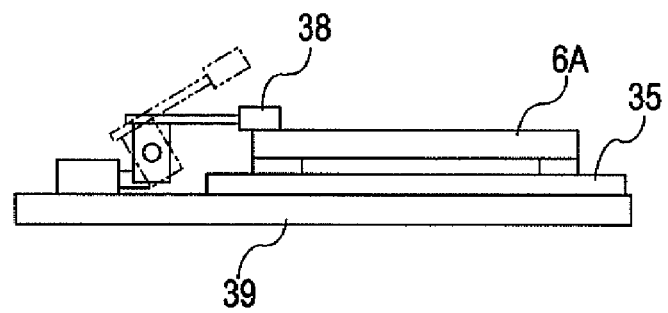
FIG. 5 is a schematic view of a reticle conveyance arm according to a third exemplary embodiment of the present invention.

FIG. 5 illustrates a third exemplary embodiment and shows another form of the reticle conveyance arm in the first exemplary embodiment. The parts not described in particular are the same as in the first exemplary embodiment.

In the first exemplary embodiment, the reticle holder is provided on the upper lid of the reticle cassette, and dust generation is prevented by fixing the reticle using the reticle holder. However, the upper lid is not present for a path from the lid opening and closing mechanism to the reticle delivery position, so the reticle is held by friction to the lower dish. If the conveyance speed or the acceleration of the reticle conveyance arm is increased in this state, the reticle is displaced on the conveyance arm, and dust is generated. If the conveyance speed is reduced so that the reticle is not displaced, device productivity deteriorates.

In this exemplary embodiment, a reticle holder 38 for fixing a reticle is provided on a reticle conveyance arm 39. The reticle holder 38 is made of an elastic body, such as a spring. As illustrated in the Figure, the reticle 6A on the lower dish 35 is held against the lower dish 35. In such a way, the reticle holder 38 can produce a force in order to avoid the reticle from being displaced during conveyance. The reticle holder 38 is disposed so that the reticle holder 38 is retracted to a position that is not in contact with the reticle when the reticle is delivered.

Fourth Exemplary Embodiment

A fourth exemplary embodiment differs from the first exemplary embodiment in that the reticle cassette 31 has a different structure. The parts not described in particular in the fourth exemplary embodiment are the same as in the first exemplary embodiment.

Figure 8A:
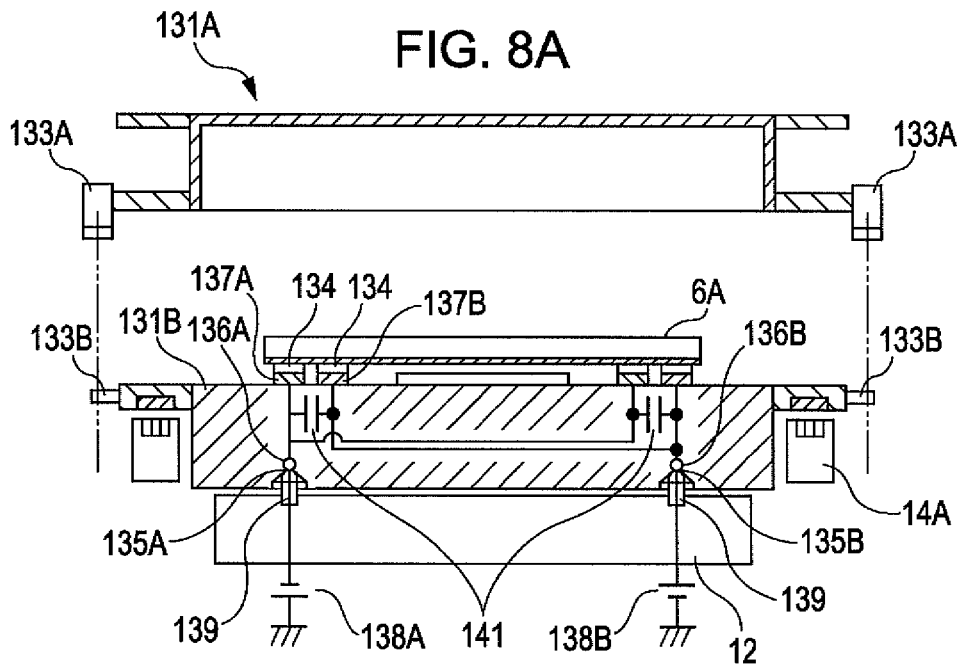
FIGS. 8A and 8B are schematic views of a second structure of the reticle cassette according to a fourth exemplary embodiment.
Figure 8B:
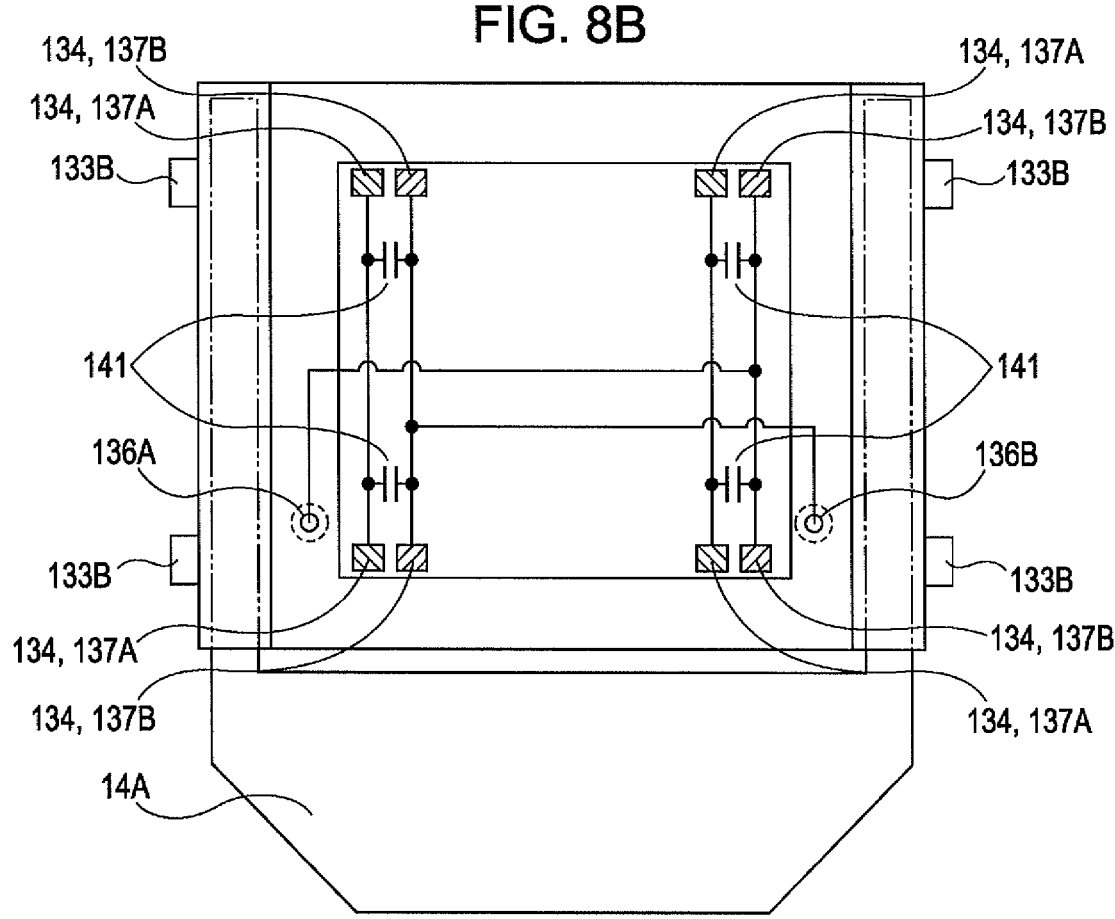

FIGS. 8A and 8B are schematic views of the reticle cassette 31 according to the fourth exemplary embodiment. The lower surface has a pattern, and the upper surface is plated with chromium. The reticle cassette 31 includes a lid 131A, a reticle-bearing portion 131B, and electrostatic chucks disposed on the reticle-bearing portion for attracting and maintaining the reticle 6A. The lid 131A and the reticle-bearing portion 131B include locking mechanisms 133A and 133B, respectively, such that the lid 131A is detachable. The locking mechanisms 133A and 133B may be mechanical clamps. However, the locking mechanisms 133A and 133B can be of a type using electromagnetic force so as to avoid the generation of particles caused by the friction between solids.

In this exemplary embodiment, the lid is convexed, and the reticle-bearing portion is flat. However, the shapes thereof are not limited to these. The lid may have any shape as long as the lid and the reticle-bearing portion form a space for accommodating a reticle, and may have, for example, an openable window.

The electrostatic chucks disposed on the reticle-bearing portion 131B each include adhesive portions 134 and electrodes 137A and 137B. The adhesive portions 134 can be composed of a dielectric such as ceramics. Moreover, the reticle-bearing portion 131B includes receiving terminals 136A and 136B for supplying charges to the electrodes 137A and 137B. Also, the reticle-bearing portion 131B includes charge-storage elements for storing charges to be supplied to the electrodes 137A and 137B. Capacitors 141 can be used as the charge-storage elements, although other components may be used as long as the components have similar functions. The capacitors 141 allow for stable charge supply even when the contacts between sending terminals 135A and 135B and the receiving terminals 136A and 136B, respectively, are cut. Moreover, no sending terminals are required of the reticle conveyance robot when the reticle storage cabinet 12, an indexer 26, or the like has the sending terminals. Thus, no electrical wires need to be routed to the movable reticle conveyance robot, thereby controlling the effects of resistance generated by the bent wires and the generation of particles from the surfaces of the wires. This advantageously reduces the cost of manufacturing robot hands.

The reticle-bearing portion 131B is held by the reticle conveyance robot 14A while being conveyed. The reticle-bearing portion 131B can be held using an electromagnet in a noncontact manner so as to avoid the generation of particles caused by the friction between solids. The reticle-bearing portion 131B may or may not be held by mechanical clamps depending on the amount of particles allowed by the exposure apparatus.

FIG. 9 illustrates the reticle conveyance robot 14A including the sending terminals 135A and 135B. The sending terminals 135A and 135B are electrically connected with power supplies 138A and 138B, respectively. The sending terminals 135A and 135B and the receiving terminals 136A and 136B are positioned using corresponding positioning pins 139 and tapered portions 140, and are brought into contact with each other so as to charge the electrodes 137A and 137B. The positions of the sending terminals and the receiving terminals are not limited to those shown in the drawing.

In this exemplary embodiment, the electrodes 137A are positively charged, and the electrodes 137B are negatively charged. When the reticle is brought into contact with the electrodes, a conductive film on a surface (either the lower surface or the upper surface may suffice) of the reticle facing these electrodes is charged such that the reticle is attracted to the electrodes. The reticle does not need to be grounded by using bipolar electrostatic chucks.

The adhesive portions 134 are disposed so as to avoid the pattern of the reticle (FIG. 8B). The adhesive portions 134 may be freely arranged so as to regulate the deformation of the reticle and to obtain sufficient adhesion for preventing the displacement of the reticle.

The reticle on the reticle-bearing portion 131B transferred to a cassette support portion (alignment stage) below the reticle alignment scope 15 is aligned by the reticle alignment scope 15. More specifically, the alignment is performed so that a mark on the reticle and a reference mark of the reticle alignment scope 15 are positioned in a predetermined range.

After the alignment, the reticle-bearing portion 131B is conveyed from the alignment stage to the reticle stage 6. At this time, the reticle-bearing portion 131B may be conveyed by the reticle conveyance robot 14A, but can be conveyed by a reticle conveyance robot 14B having higher conveying accuracy such that the reticle-bearing portion, on which the reticle after positioning is mounted, is conveyed with high accuracy. The reticle-bearing portion 131B is held by the reticle conveyance robot 14B while being conveyed. The reticle-bearing portion 131B can be held using electromagnets 144 and 145 in a noncontact manner so as to avoid the generation of particles caused by the friction between solids. The reticle-bearing portion 131B may or may not be held by mechanical clamps depending on the amount of particles allowed by the exposure apparatus.

FIG. 10 illustrates the reticle-bearing portion 131B conveyed to the reticle stage 6. The reticle stage 6 includes an electrostatic chuck 6B for attracting the reticle 6A. The reticle-bearing portion 131B includes a discharge switch 142 for the capacitors for instantly removing the attractive force of the adhesive portions 134. Moreover, the reticle stage 6 includes a push pin 143 for turning the discharge switch 142 on. When the reticle-bearing portion 131B approaches the reticle stage 6, the switch is closed by the push pin 143, and the residual attractive force is instantly removed. At this time, the reticle is transferred to the charged electrostatic chuck disposed on the reticle stage 6. Methods for removing the attractive force are not limited to this, and may be performed in a noncontact manner so as to regulate the generation of particles.

Moreover, a particle collector 146 may be provided in the vicinity of the reticle-bearing portion 131B or the reticle stage 6. Particles existing between the reticle and the reticle-bearing portion 131B can be collected by the particle collector. An electrostatic precipitator, for example, may be used as the particle collector.

Thus, the possibility of friction between the reticle and other substances while the reticle is transferred to the reticle stage 6 is markedly reduced by holding the reticle on the reticle-bearing portion 131B using the electrostatic chucks. Removal of friction can control the generation of particles and the adhesion of the particles to the reticle, thereby reducing the number of device pattern defects.

In this exemplary embodiment, the reticle is held by the reticle-bearing portion 131B while the lower surface of the reticle adheres to the electrostatic chucks of the reticle-bearing portion, and is transferred to the reticle stage 6 such that the upper surface of the reticle adheres to the chuck of the reticle stage. With this structure, the generation of particles can be prevented since the reticle is not transferred from a robot hand to another. Moreover, the electrostatic chucks generate a force perpendicular to the holding surface, and therefore, the generation of friction can be prevented during release of the reticle, resulting in the generation of fewer particles. Since only the reticle can be transferred to the chuck of the reticle stage, the weight of the movable body including the stage should be no larger than necessary.

Moreover, the reticle is conveyed to the reticle stage 6 without coming into contact with the reticle conveyance robots since the reticle-bearing portion 131B, which is integrated with the reticle, is held and conveyed by the reticle conveyance robots. Thus, the generation of particles can be reduced. Furthermore, the reticle is fixed to the reticle-bearing portion by the electrostatic attraction while being conveyed. Thus, the generation of particles caused by the lateral friction between the reticle-bearing portion and the reticle can be reduced.

Moreover, the reticle cassette can be stored and conveyed without coming into contact with the upper surface of the reticle. Since the reticle is held by the electrostatic chuck of the reticle stage 6 at the upper surface thereof, foreign bodies adhering to the upper surface degrade the flatness of the reticle, and influence the exposure accuracy. According to the structure of the present invention, no objects come into contact with the upper surface of the reticle as described above, and thus the possibility of adherence of foreign bodies is reduced.

After the reticle is transferred to the reticle stage 6, the reticle-bearing portion 131B is conveyed to the lid opening and closing unit 13 by the reticle conveyance robot. The lid opening and closing unit 13 attaches the lid 131A to the reticle-bearing portion 131B. The reticle conveyance robot 14A then conveys the reticle cassette having the lid attached thereto from the lid opening and closing unit 13 to the reticle storage cabinet 12. The empty reticle cassette is stored in the reticle storage cabinet 12.

FIG. 11 is a flow chart illustrating a process of conveying a reticle using the above-described reticle cassette. In the following, the start of the reticle transfer is detailed. First, a reticle is put in a reticle cassette (Step S101). In the reticle cassette, the reticle is disposed such that the pattern surface thereof adheres to and is supported by the adhesive portions 134 of the reticle-bearing portion 131B in an electrostatic manner (Step S102). The reticle cassette is sent into the exposure apparatus using the indexer 26 (Step S103). The reticle cassette is sent into the vacuum chamber 3 via the load-lock chamber 24 (Step S104). The reticle cassette is sent into and stored in the reticle storage cabinet (Step S105). The capacitors provided in the reticle-bearing portion of the reticle cassette may be charged by the sending terminals provided in the reticle storage cabinet. Charge storage may be performed at units other than the reticle storage cabinet. The reticle cassette is transferred from the reticle storage cabinet to the lid opening and closing unit (Step S106). The lid of the reticle cassette is removed from the reticle-bearing portion by the lid opening and closing unit (Step S107).

The reticle-bearing portion is transferred from the lid opening and closing unit to the alignment stage (Step S108). The electrostatic adhesion of the reticle may be performed at any point in Steps S101 to S108. The reticle is aligned (Step S109). The reticle-bearing portion is transferred from the alignment stage to the reticle stage 6 (Step S110). The electrostatic adhesion of the reticle by the reticle-bearing portion is released (Step S111). Particles in the vicinity of the reticle are collected by the particle collector (Step S112). The reticle is transferred to the reticle chuck of the reticle stage so as to be supported by the reticle chuck at the surface having no pattern (Step S113). Thus, the reticle transfer is completed. After exposure, the reticle is held in the reticle cassette and is conveyed to the reticle storage cabinet.

In this manner, the number of contacts and separations between the reticle and other substances can be regulated, and thus the generation of particles can be reduced during conveyance of the reticle.

In order to reduce the number of contacts between the reticle and other substances, a frame may be attached to the reticle while the reticle is conveyed and used for exposure. However, the reticle may be deformed by a force generated by the frame when the frame is fitted onto the reticle. In contrast, when the fitting accuracy is reduced, the reticle is displaced while being conveyed. The displacement of the reticle leads to the generation of particles due to the friction between the reticle and the frame.

An Example of a Method for Manufacturing a Device Using an Exposure Apparatus

Figure 6:
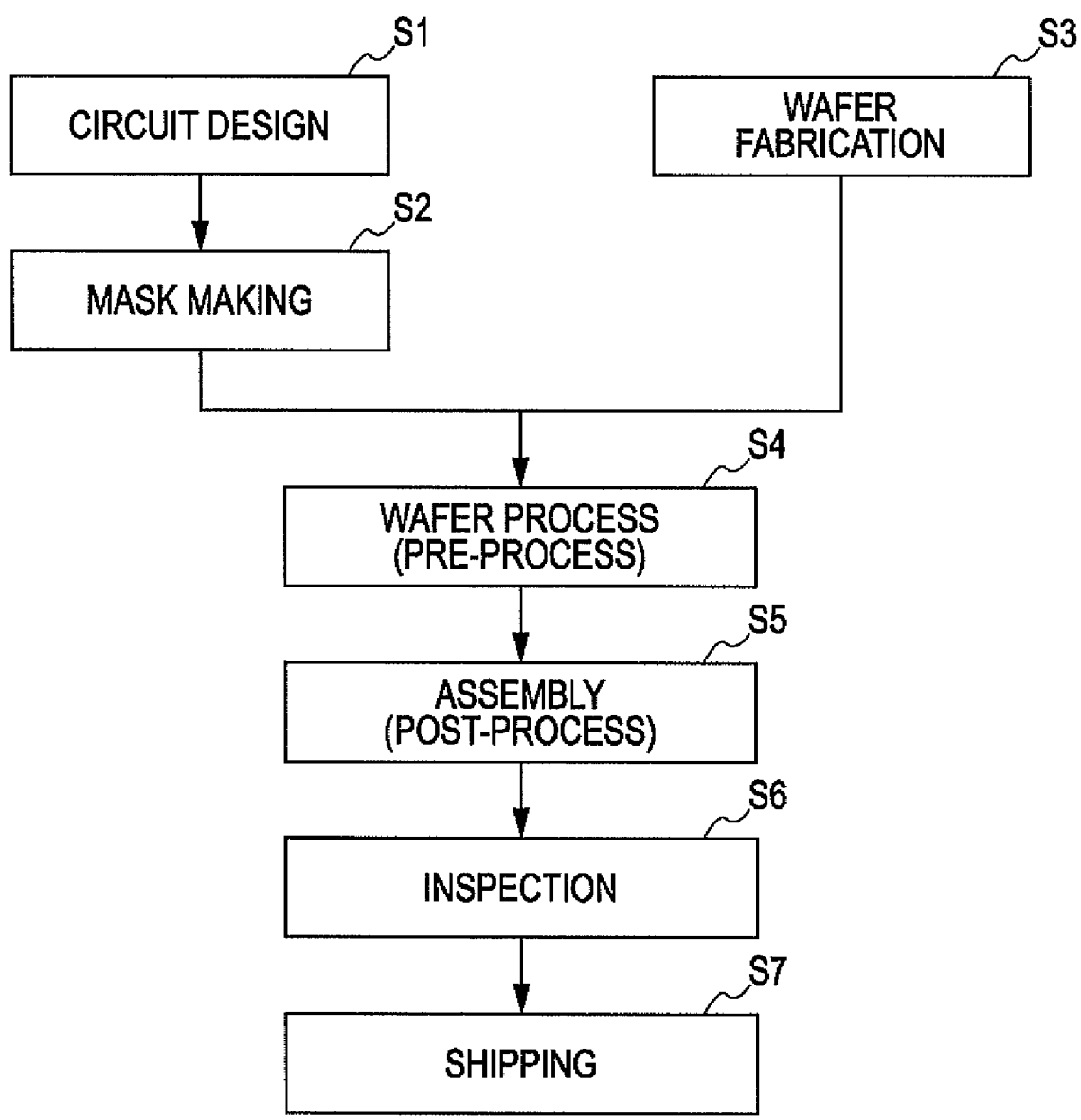
FIG. 6 is a flowchart for a method for manufacturing a device.

An embodiment of a method for manufacturing a device using the exposure apparatus described above is described with reference to FIGS. 6 and 7. FIG. 6 is a flowchart for describing manufacture of a device (e.g., a semiconductor chip, such as an integrated circuit (IC) and a large-scale integration, a liquid crystal display (LCD), and a charge-coupled device (CCD)). Here, a method for manufacturing a semiconductor chip is described by way of example.

In step S1 (circuit design), a circuit for the semiconductor device is designed. In step S2 (mask making), a mask is made on the basis of the designed circuit pattern. In step S3 (wafer fabrication), a wafer is fabricated using a material such as silicon. In step S4 (wafer process), which is called a pre-process, an actual circuit is formed on the wafer by lithography utilizing the exposure apparatus using the mask and the wafer. Step S5 (assembly), which is called a post-process, is a step that produces the form of a semiconductor chip by using the wafer formed in step S4, and includes an assembly process including an assembly sub-process (dicing and bonding) and a packaging sub-process (chip encapsulation). In step S6 (inspection), inspections, such as an operation confirmation test and a durability test of the semiconductor device formed in step S5, are conducted. The manufacture of the semiconductor device is completed after these steps, and then the semiconductor device is shipped (step S7).

Figure 7:
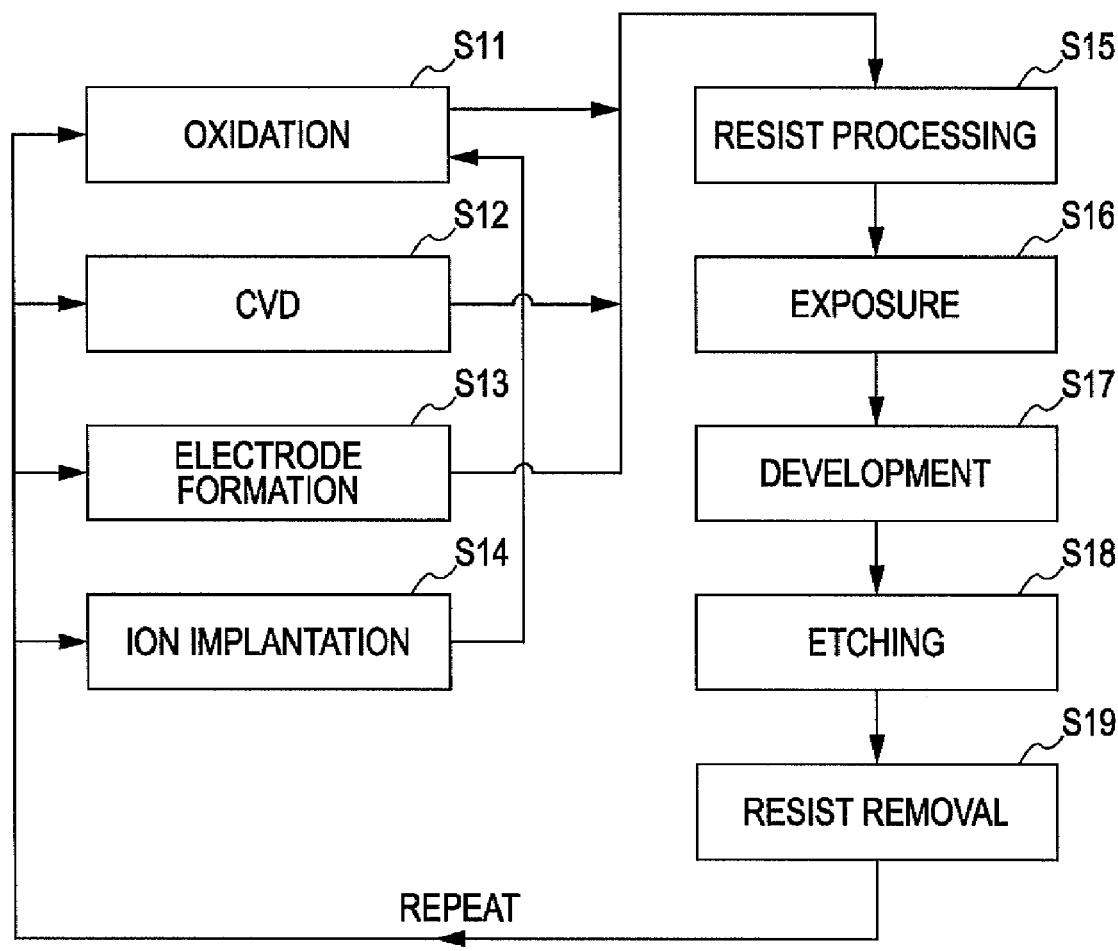
FIG. 7 illustrates a wafer process.

FIG. 7 is a flowchart that shows the details of the wafer process of step S4 shown in FIG. 6. In step S11 (oxidation), the wafer surface is oxidized. In step S12 (chemical-vapor deposition (CVD)), an insulating film is formed on the wafer surface. In step S13 (electrode formation), an electrode is formed on the wafer. In step S14 (ion implantation), ions are implanted in the wafer. In step S15 (resist processing), the wafer is coated with a photosensitive agent. In step S16 (exposure), the exposure apparatus described above exposes the wafer with the circuit pattern of the mask. In step S17 (development), the exposed wafer is developed. In step S18 (etching), an area where the developed resist image is absent is removed. In step S19 (resist removal), the resist, which is unnecessary after etching, is removed. These steps are repeated to form multiple overlapping circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

What is claimed is:

1. An exposure apparatus comprising:
a vacuum chamber;
a load-lock chamber disposed between the vacuum chamber and outside the exposure apparatus;
a reticle cassette configured to hold a reticle;
a conveying unit configured to convey the reticle cassette between the vacuum chamber and the load-lock chamber; and
an opening and closing unit configured to open and close the reticle cassette,
wherein the opening and closing unit is disposed within the vacuum chamber.

2. The exposure apparatus according to claim 1, further comprising:
a storage portion configured to store the reticle cassette, wherein the storage portion is disposed within the vacuum chamber.

3. The exposure apparatus according to claim 2, wherein the storage portion is configured to store a plurality of reticle cassettes.

4. The exposure apparatus according to claim 1, further comprising:
a reticle stage; and
a delivery unit configured to deliver the reticle in the reticle cassette to the reticle stage, wherein the delivery unit is disposed within the vacuum chamber.

5. The exposure apparatus according to claim 4, further comprising:
a dust suction unit configured to suck dust, the dust suction unit being disposed in a path for conveying the reticle cassette between the opening and closing unit and the delivery unit.

6. The exposure apparatus according to claim 1, further comprising a dust suction unit configured to suck dust.

7. The exposure apparatus according to claim 1, wherein the reticle cassette includes an upper lid and a lower dish, and the opening and closing unit is configured to detach and attach the upper lid.

8. The exposure apparatus according to claim 7, further comprising:
a conveyance arm configured to convey the reticle cassette,
wherein the conveyance arm includes a holding unit configured to hold the reticle against the lower dish and retain the reticle.

9. A method for manufacturing a device, the method comprising the steps of:
exposing a wafer using the exposure apparatus according to claim 1; and
developing the exposed wafer.

10. The exposure apparatus according to claim 1, wherein the reticle cassette includes a reticle-bearing portion configured to bear the reticle and a lid configured to cover the reticle-bearing portion, and the reticle-bearing portion includes an electrode configured to cause a pattern surface of the reticle to adhere to the reticle-bearing portion by an electrostatic force so that the reticle is supported by the reticle-bearing portion.

11. The exposure apparatus according to claim 10, wherein the reticle-bearing portion includes a receiving terminal used for supplying a charge to the electrode.

12. The exposure apparatus according to claim 10, wherein the reticle-bearing portion includes a storage unit configured to store a charge to be supplied to the electrode.

13. The exposure apparatus according to claim 10, wherein the reticle-bearing portion includes a collection unit configured to collect particles existing between the supported reticle and the reticle-bearing portion.

14. The exposure apparatus according to claim 11, wherein the conveying unit includes a sending terminal used for supplying the charge to the receiving terminal.

15. The exposure apparatus according to claim 11, further comprising:
a storage portion configured to store the reticle cassette,
wherein the storage portion includes a sending terminal used for supplying the charge to the receiving terminal.

* * * * *